United States Patent
Chan et al.

[11] Patent Number: 5,879,168
[45] Date of Patent: Mar. 9, 1999

[54] SINGLE C-BEAM CONTACT

[75] Inventors: Benson Chan, Vestal; Fletcher L. Chapin, Maine, both of N.Y.

[73] Assignee: International Business Machines Corporation, Armonk, N.Y.

[21] Appl. No.: 865,599

[22] Filed: May 29, 1997

[51] Int. Cl.[6] .................................................. H01R 9/09
[52] U.S. Cl. ............................................. 439/66; 439/591
[58] Field of Search .............................. 439/66, 74, 246, 439/252, 83, 591

[56] References Cited

U.S. PATENT DOCUMENTS

| | | |
|---|---|---|
| 3,509,270 | 4/1970 | Dube et al. . |
| 4,505,529 | 3/1985 | Barkus . |
| 5,167,512 | 12/1992 | Walkup . |
| 5,184,962 | 2/1993 | Noschese . |
| 5,230,632 | 7/1993 | Baumberger et al. ................ 439/66 |
| 5,248,262 | 9/1993 | Busacco et al. . |
| 5,380,210 | 1/1995 | Grabbe et al. . |

*Primary Examiner*—Neil Abrams
*Assistant Examiner*—Brian J. Biggi
*Attorney, Agent, or Firm*—Ratner & Prestia; Arthur J. Samodovitz

[57] ABSTRACT

A connector having a connector body with opposing end contacts. The connector also includes tabs coupled to the connector body and positioned between the opposing end contacts. Provided between the tabs and the opposing end contacts are circular stabilizers. When no force is applied to the opposing end contacts, the tabs and the circular stabilizers hold the connector in a cylindrical holder. When a compressive force is applied on each opposing end contact, the circular stabilizers pivot about an axis while maintaining the position of the connector in the holder. Further, as the opposing end contacts are compressed, they move across the connector surface of the component making contact with the connector. The movement of the opposing end contacts "wipes" across the surface and, thus, forms a good electrical connection between the connector and the surface.

15 Claims, 5 Drawing Sheets

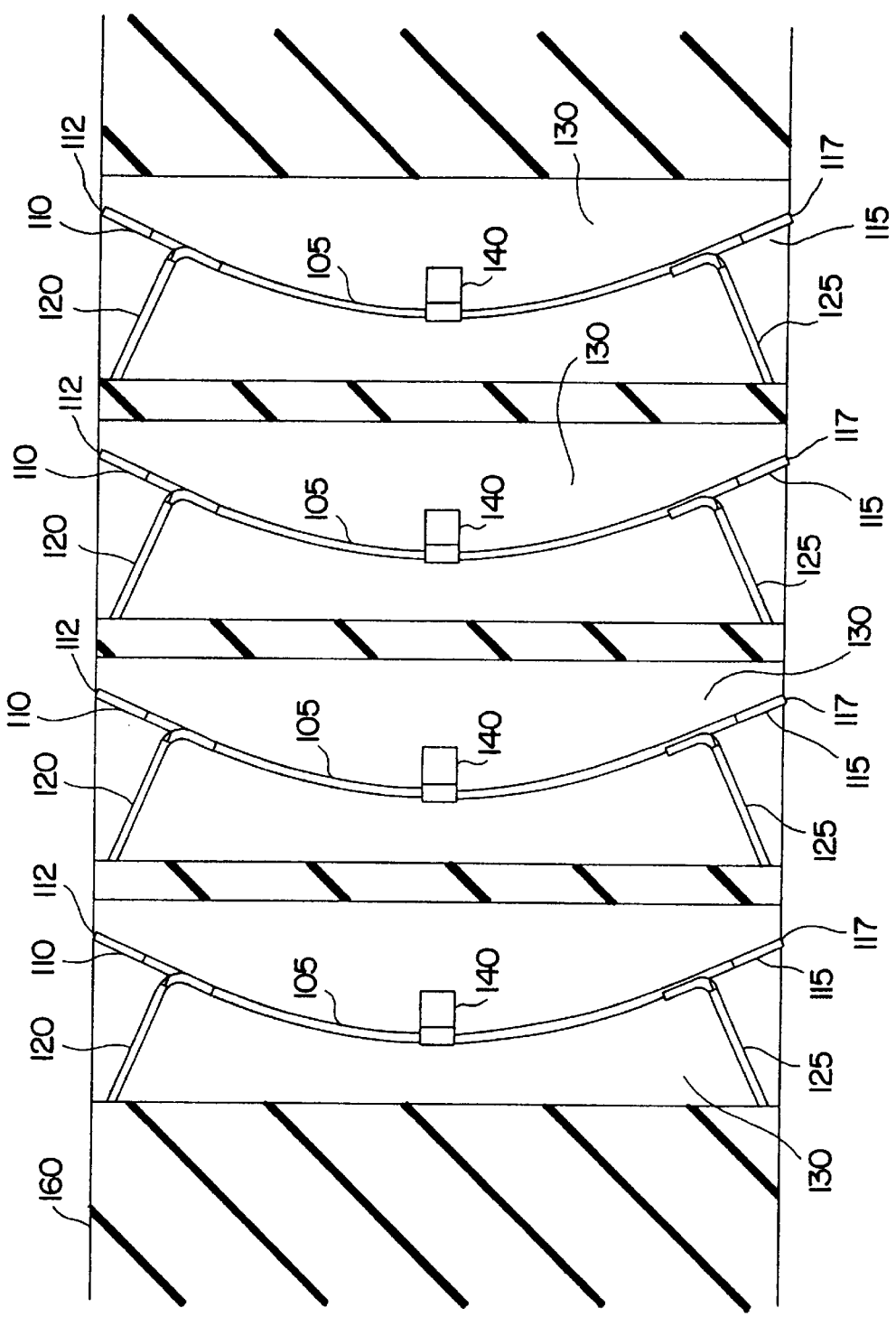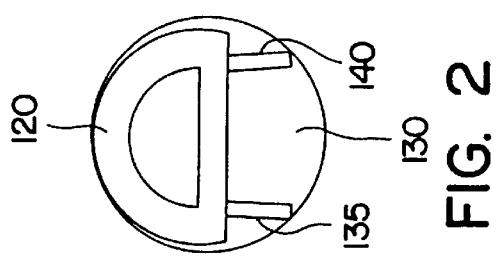

SINGLE C-BEAM CONTACT

FIELD OF THE INVENTION

The present invention relates to the field of electrical connectors and particularly to electrical connectors for interconnecting at least two electrical circuit members such as printed circuit boards, circuit modules, or the like, and to electrical connectors for forming test probe contacts.

BACKGROUND OF THE INVENTION

The current trend in connector design, for those connectors utilized in the computer field, is to provide both high density and reliable connections between various circuit devices which form important parts of the computer. It is essential that such connectors be highly reliable because potential computer failure may occur if misconnections of these devices occur. Further, to assure effective repair, upgrade, or replacement of various components of a computer system (i.e. connectors, cards, boards, chips, modules, etc.), it is also highly desirable that such connections be separable and reconnectable in the field within the final product, as well as tolerant of dust and fibrous debris. Such capability is also desirable during the manufacturing process for the products.

In order to ensure a good connection, a connector should provide spring tension to maintain the connection and a "wiping action." The wiping action forms a good connection by removing debris from between the connector and the component.

One prior technique for providing connections is described in U.S. Pat. No. 5,248,262 issued to Busacco et al. Busacco et al. discloses an electrical connector for interconnecting a pair of circuit members (e.g., a circuit board and a module) which, in one embodiment, includes a housing, at least one flexible circuit within the housing, and a spring attached to the flexible circuit at two spaced locations for exerting force against the flexible circuit to cause the circuit to engage respective conductive pads on the circuit members when the circuit members are moved toward each other (e.g., compressed). The shape of the spring conforms substantially to the portion of the flexible circuit between the locations of the attachment. In another embodiment, a connector for interconnecting such circuit members includes a housing located between the circuit members and an elongated, compressible contact member in the housing with conductive end portions for engaging the circuit members. The contact member occupies a first, pre-stressed position before engagement and moves to a second, compressed position during engagement. The conductive end portions of the flexible circuit in the first embodiment and the contact member in the second embodiment preferably comprise a plurality of dendrites for providing enhanced connections.

Frequently, there are requests to change the pitch of the contact or to depopulate the center portion for chip down applications. Further, it is often necessary to provide for custom designs and easy prototyping systems. The system described in the Busacco et al. reference requires costly changes to plastic molds and flexible tooling to implement changes for custom designs and to provide for prototyping.

Therefore, it is desirable to provide a high-density electrical connector providing effective, reliable connections in which the connections are repeatable. It is also desirable to provide a connector that permits custom designs, easy prototyping, and less expensive tooling.

It is an object of the invention, therefore, to provide an electrical connector capable of providing high-density interconnections that are highly reliable and which can be readily separated and repeated if desired. It is another object of the invention to provide connectors which allow for custom designs, easy prototyping, and less expensive tooling.

SUMMARY OF THE INVENTION

To achieve these and other objects, and in view of its purposes, the present invention provides a connector having a connector body with opposing end contacts. The connector also includes tabs coupled to the connector body and positioned between the opposing end contacts. Provided between the tabs and the opposing end contacts are circular stabilizers. When no force is applied to the opposing end contacts, the tabs and the circular stabilizers hold the connector in a cylindrical holder. When a compressive force is applied on each opposing end contact, the circular stabilizers pivot about an axis while maintaining the position of the connector in the holder. Further, as the opposing end contacts are compressed, they move across the connector surface of the component making contact with the connector. The movement of the opposing end contacts "wipes" across the surface and, thus, forms a good electrical connection between the connector and the surface.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 2 is a top view of the connector shown in FIG. 1.

FIG. 3 is a schematic diagram of the connector according to an exemplary embodiment of the present invention.

DETAILED DESCRIPTION OF THE INVENTION

Figure 1:
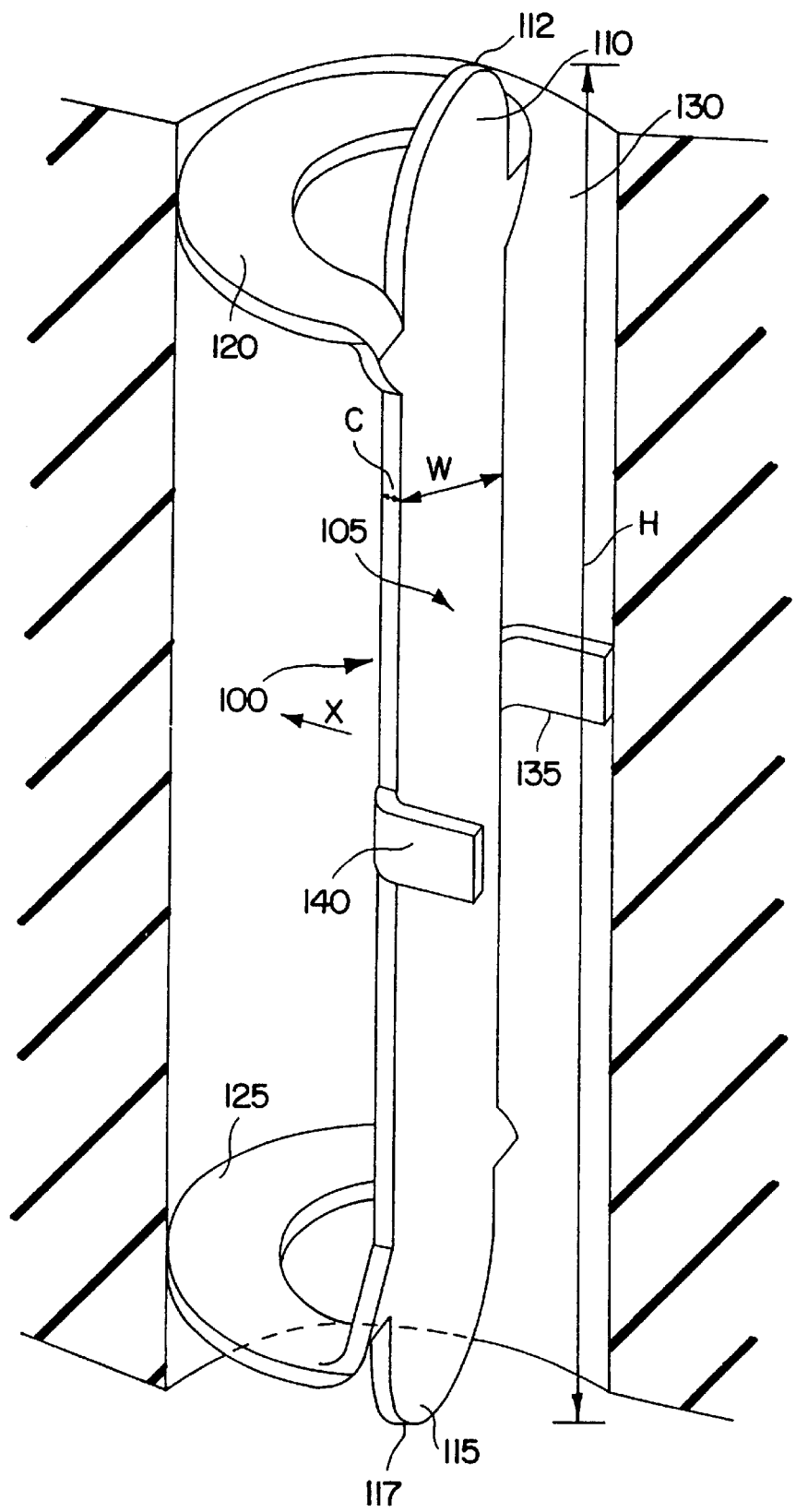
FIG. 1 is a perspective view of the connector according to an exemplary embodiment of the present invention.

Referring now to the drawing wherein like reference numerals refer to like elements throughout, FIG. 1 shows a IBM C-Beam™ connector according to an exemplary embodiment of the present invention. The connector 100 is positioned in a cylindrical cavity 130. The connector 100 includes a connector body 105 having contacts 110 and 115 formed at either end of the connector body. Tabs 135 and 140 are formed on the connector body 105 between the contacts 110 and 115. For example, the tabs 135 and 140 are formed at a center area between the tabs 110 and 115. A circular stabilizer 120 is formed between the contact 110 and the tabs 135 and 140. Similarly, a circular stabilizer 125 is formed between contact 115 and the tabs 135 and 140. FIG. 2 is a top view of the connector 100 shown in FIG. 1.

The connector body 105 has an arcuate shape so that, when pressure is exerted on the contacts 110 and 115, the tabs 135 and 140 move in the x-direction, shown in FIG. 1.

The size of circular stabilizers 120 and 125 and tabs 135 and 140 are selected so that, when the connector 100 is positioned in the cylindrical cavity 130, circular stabilizers 120 and 125 and the tabs 135 and 140 contact the inner surface of the cylindrical cavity 130. As a result, when the connector 100 is positioned in the cylindrical cavity 130, circular stabilizers 120 and 125 and tabs 135 and 140 hold the contact connector 100 in the cylindrical cavity 130.

As is shown in FIG. 3, when force is exerted on the end surface 112 of the contact 110 and the end surface 117 of the contact 115, the connector 100 bends so that the tabs 135 and 140 move away from the inner surface of the cylindrical cavity 130. In addition, circular stabilizers 120 and 125 rotate and maintain contact with the inner surface of the cylindrical cavity 130 preventing the connector 100 from shifting in the cylindrical cavity 130. Thus, misalignment between the surface of the contact pads 405, shown in FIG. 4, and connector 100 does not occur.

Figure 4:
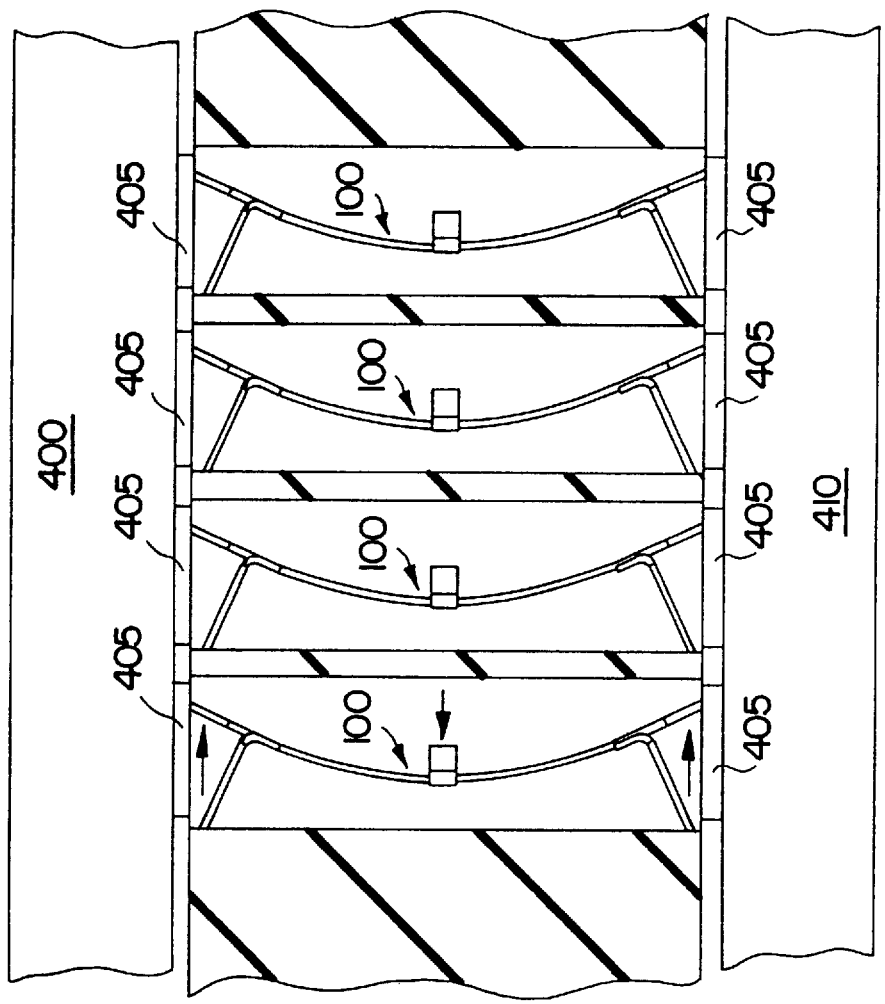
FIG. 4 is a schematic diagram illustrating the use of the connectors shown in FIGS. 1 through 3.
Figure 5:
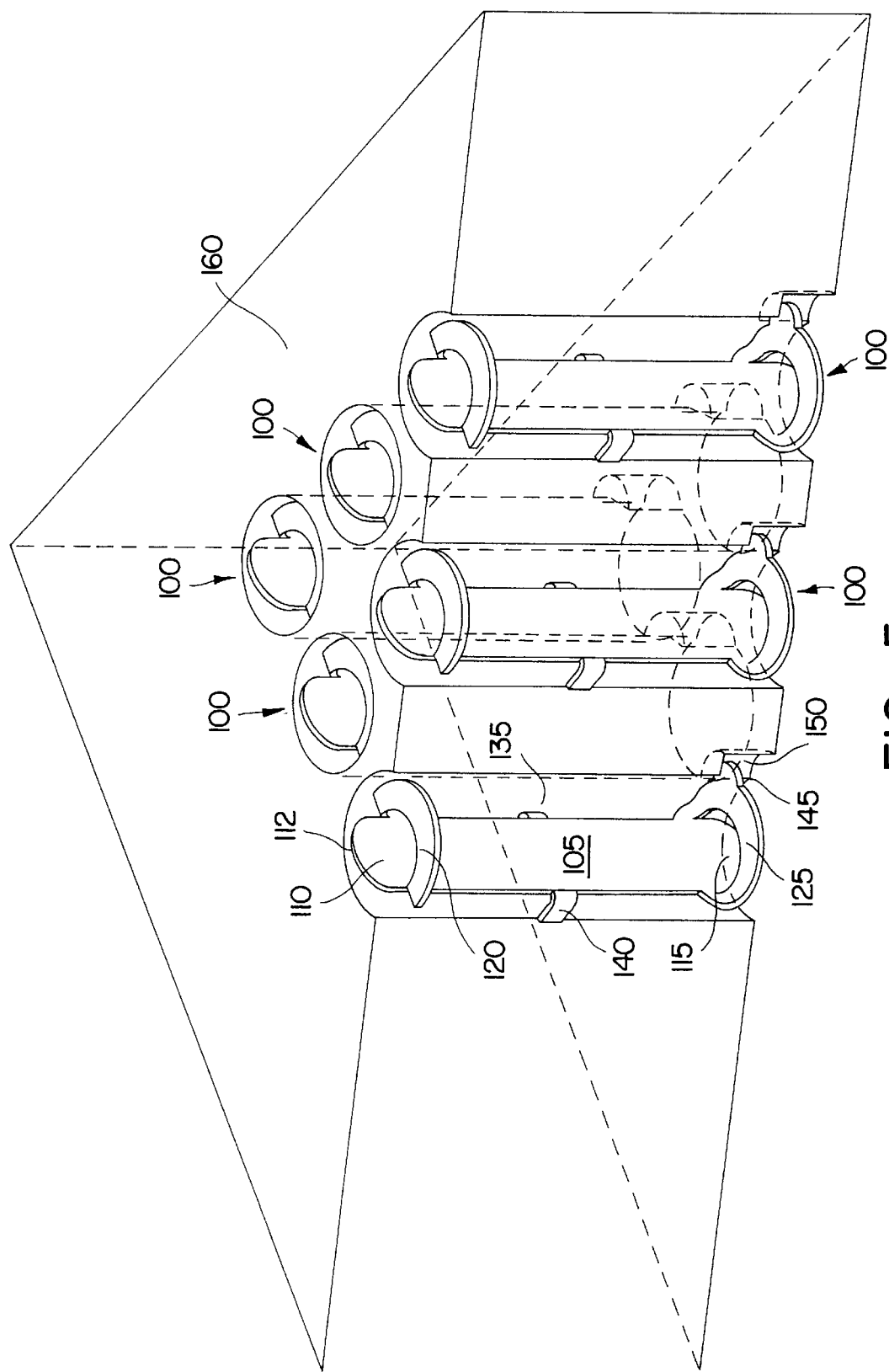
FIG. 5 is a perspective view of a plurality of connectors positioned in a board according to an exemplary embodiment of the present invention.

Typically, as is shown in FIG. 5, there are a plurality of connectors 100 formed in cylindrical cavities 130 in a connector board 160. The mating surfaces of the components 400 and 410 may have variations. Thus, when the components 400 and 410 (shown in FIG. 4) form a connection with prior art connectors, damage may result to the components 400 and 410 because of the uneven force applied to the components 400 and 410. Further, a reliable connection may not be formed because of the uneven force exerted by the prior art connectors. In other words, the prior art connectors exert an uneven normal force due to the different deflections of each of the contact members.

The present invention avoids this problem because the connectors 100 exert a constant normal force once the critical load of the connector is exceeded. As force is exerted on the end surfaces 112 and 117, the connector 100 exerts an opposing and increasing force until a critical load in the cross section of the connector 100 is exceeded. This load is, for example, fifty (50) grams of force. After this point, a constant normal force is exerted by the connector 100. To reduce the initial load of the connectors 100, the connector body 105 is pre-bent (i.e. —pre-loaded) by the addition of tabs 135 and 140.

FIG. 4 is a schematic diagram of the connector 100 forming an electrical connection between components 400 and 410. The electrical components 400 and 410 include contact pads 405. As contact pads 405 compress against the end surfaces 112 and 117 of the connector 100, the connector 100 bends and exerts a force against the contacts pads 405. As greater force is exerted on the end surfaces 112 and 117 by the contact pads 405, the end surfaces 112 and 117 move across the surface of the contact pads 405 in a wiping action that removes debris and other materials such as metal oxides that may be formed on the contact pad 405. As a result, a good electrical connection is formed between the connector 100 and the contact pads 405.

The connectors 100 are positioned in cylindrical cavities 130 formed in the connector board 160. The connector board 160 is formed, for example, of a molded engineering plastic or a glass resin material such as G-10. The cylindrical cavity 130 can be formed in the connector board 160 by drilling. As a result, the layout of the cylindrical cavities 130 containing connectors 100 can be customized or arranged for easy prototyping using relatively inexpensive tooling. The cylindrical cavity 130 can be spaced, for example, on 0.00125 cm (0.05 inch) centers. The relative distance between the centers may be increased or decreased.

The material for the connector 100 is selected to provide spring action, electrical conductivity, and little degradation due to changes in temperature. In addition, the material for the connector 100 is selected based on its workability. One material suitable for use in connector 100 is beryllium copper. Alternatively, phosphorus bronze or spring steel may be used. The connector 100 can be formed using die stamping.

The connector 100 may be formed using a progressive die. The connector 100 may be stamped so that two or more connectors 100 are connected together after the stamping process is completed. For example, individual connectors 100 could be connected together at tabs 140 and 135. In this case, after the G-10 material or molded plastic connector board is drilled to form the cylindrical cavities 130, the connectors 100 would be inserted and then separated into the cylindrical cavities 130.

An exemplary connector 100 constructed of beryllium copper and that provides a maximum contact force of 50 grams has a width w, shown in FIG. 1, of 0.0889 cm (0.035 inches), a cross-sectional length C of 0.05842 cm (0.023 inches), and a length H of 0.50038 cm (0.197 inches). The length of the connector 100 (or contact beam) is minimized to reduce the occurrence of noise in the electrical path.

In an alternative embodiment, dendrites may be formed on the end surfaces 112 and 117. In this case, the dendrites provide a "z-wipe" action where the dendrites pierce into the material of the contact pad 405 forming a good electrical connection. Because the wiping action is provided by the z-wipe created by the dendrites, the length of the connector 100 may be reduced so that the contacts 110 and 115 do not wipe across the contact pads 405 but still exert an opposing force to ensure good electrical contact.

As is shown in FIG. 5, the connector 100 may also include an alignment tab 145. The cylindrical cavity 130 also has a corresponding recess 150. When the connector 100 is positioned in the cylindrical cavity 130, the alignment tab 145 is received in recess 150. As a result, alignment tab 145 and the recess 150 ensure the proper orientation of the connector 100 in cylindrical cavity 130.

Figure 6:
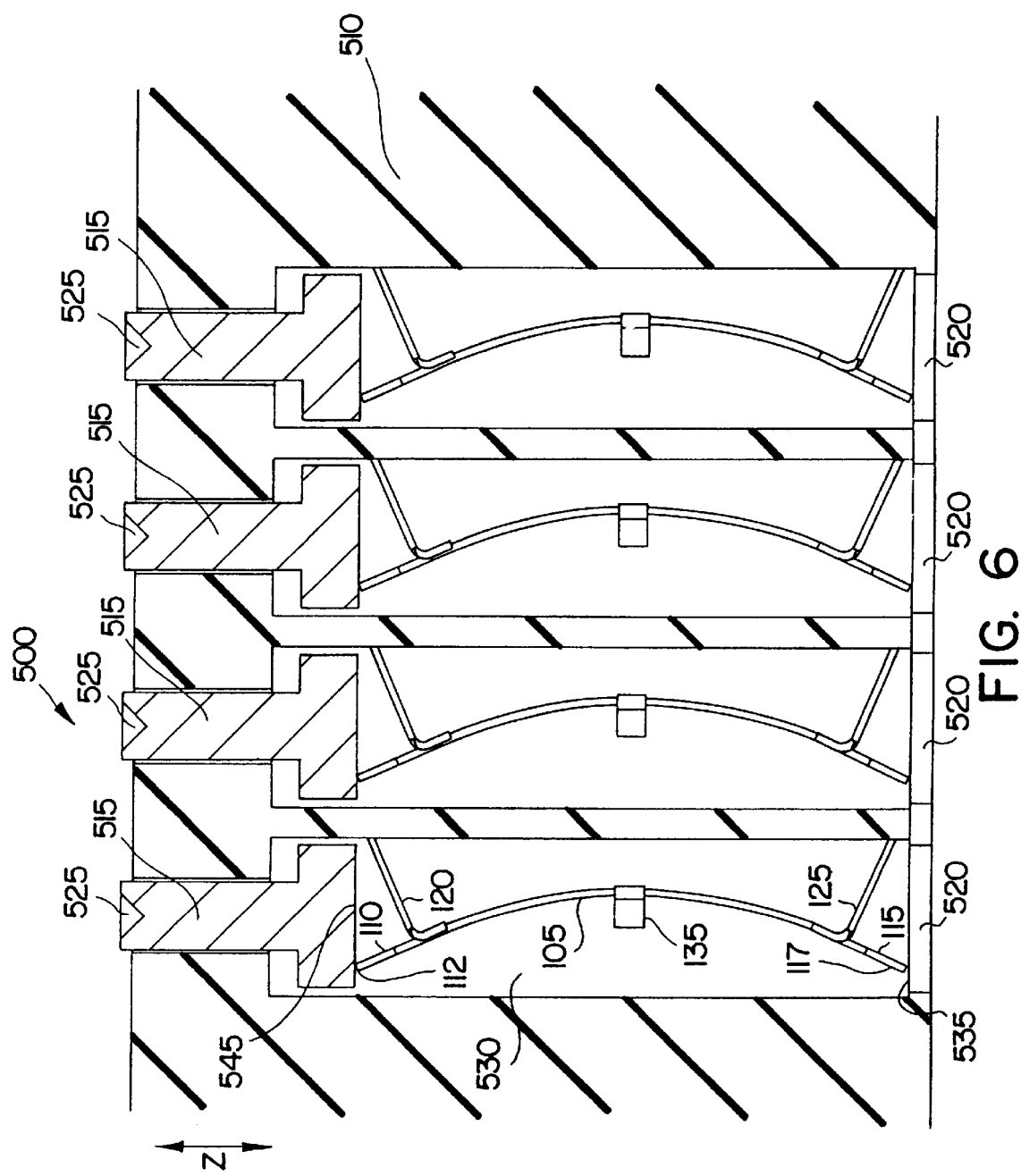
FIG. 6 is a schematic diagram of a test probe using the connectors according to another exemplary embodiment of the present invention.

FIG. 6 is a schematic diagram of a constant load probe 500 using connectors 100 according to another exemplary embodiment of the present invention. The connectors 100 are the same as the connectors 100 shown in FIG. 1. The cylindrical cavity 530 formed in the probe housing 510 forms an electrical connection between test probes 515 and interconnections 520 which are coupled to a test apparatus (not shown). The test probes 515 move in the z-direction.

The pins of a chip (not shown) are brought in contact with test probes 515. Cone-shaped grooves 525 are formed in the ends of the test probes 515 for receiving and aligning the pins of the chip to be tested. As pressure is exerted on the test probes 515 by the pins of the chip, test probes 515 move toward the connectors 100. This process causes the connectors 100 to bend and wipe the surface 545 of the test probe 515 and the surface 535 of the interconnections 520 to form a good electrical connection between the test probe 515 and the interconnections 520.

Although illustrated and described herein with reference to certain specific embodiments, the present invention is nevertheless not limited to the details shown. Rather, various modifications may be made in the details within the scope and range of equivalence of the claims and without departing from the spirit of the invention.

What is claimed is:

1. A connector disposed in a cavity of a holder defined by an inner surface, the connector comprising:

a body having a first contact and a second contact;

a central tab formed between the first contact and the second contact, the central tab engaging the inner surface of the cavity of the holder and exerting a pre-load on the connector before a compressive force is applied to the first and second contacts then disengaging the inner surface of the cavity of the holder after a compressive force is applied to the first and second contacts;

a first stabilizer formed between the first contact and the central tab; and a second stabilizer formed between the central tab and the second contact, the first and second stabilizers engaging continually the inner surface of the cavity of the holder both before and after a compressive force is applied to the first and second contacts.

2. The connector according to claim 1 wherein the body has an arcuate shape.

3. The connector according to claim 1 wherein dendrites are formed on the first contact.

4. The connector according to claim 1 wherein the connector exerts a constant normal force in response to the assertion of a compressive force on the first and second contacts.

5. The connector according to claim 1 further comprising an alignment tab formed on the body.

6. The connector according to claim 1 wherein the holder is a connector board.

7. The connector according to claim 6 wherein the body has an arcuate shape.

8. The connector according to claim 6 wherein dendrites are formed on the first contact.

9. The connector according to claim 6 wherein the connector exerts a constant normal force in response to the assertion of a compressive force on the first and second contacts.

10. The connector according to claim 6 further comprising an alignment tab formed on the body and an alignment recess formed in the cylindrical cavity for receiving the alignment tab.

11. The connector according to claim 1 wherein the holder is a probe housing with a probe formed at one end of the cavity and a connector pad formed at the other end of the cavity and wherein the connector body is positioned between the probe and the connector pad with the first contact contacting the probe and the second contact contacting the connector pad.

12. The connector according to claim 11 wherein the body has an arcuate shape.

13. The connector according to claim 11 wherein dendrites are formed on the first contact.

14. The connector according to claim 11 wherein the connector exerts a constant normal force in response to the assertion of a compressive force on the first and second contacts.

15. The connector according to claim 11 further comprising an alignment tab formed on the body.

* * * * *